(12) United States Patent
Lesonen et al.

(10) Patent No.: US 11,101,334 B2
(45) Date of Patent: Aug. 24, 2021

(54) THIN FILM DISPLAY ELEMENT

(71) Applicant: Beneq Oy, Espoo (FI)

(72) Inventors: Janne Lesonen, Espoo (FI); Olli Pekonen, Espoo (FI)

(73) Assignee: Beneq Oy, Espoo (FI)

( * ) Notice: Subject to any disclaimer, the term of this patent is extended or adjusted under 35 U.S.C. 154(b) by 0 days.

(21) Appl. No.: 16/970,716

(22) PCT Filed: Feb. 21, 2019

(86) PCT No.: PCT/FI2019/050142
§ 371 (c)(1),
(2) Date: Aug. 18, 2020

(87) PCT Pub. No.: WO2019/162574
PCT Pub. Date: Aug. 29, 2019

(65) Prior Publication Data
US 2020/0381488 A1 Dec. 3, 2020

(30) Foreign Application Priority Data
Feb. 23, 2018 (FI) ........................... 20185173

(51) Int. Cl.
*G06F 3/041* (2006.01)
*H01L 27/32* (2006.01)
*G06F 3/044* (2006.01)

(52) U.S. Cl.
CPC .......... *H01L 27/323* (2013.01); *G06F 3/0412* (2013.01); *G06F 3/0445* (2019.05); *H01L 27/3237* (2013.01)

(58) Field of Classification Search
CPC ..... G06F 3/0445; G06F 3/0412; H01L 27/323
(Continued)

(56) References Cited

U.S. PATENT DOCUMENTS 10,503,294 B2 * 12/2019 Kim ...................... G06F 3/0446
2011/0057899 A1 * 3/2011 Sleeman ............... G06F 3/0445
345/174

(Continued)

FOREIGN PATENT DOCUMENTS

| CN | 107104131 A | 8/2017 |
|---|---|---|
| WO | WO 2016/208233 A1 | 12/2016 |
| WO | WO 2018/032996 A1 | 2/2018 |

OTHER PUBLICATIONS

International Search Report for corresponding International Patent Application No. PCT/FI2019/050142 dated May 23, 5 pages.
(Continued)

*Primary Examiner* — Calvin C Ma
(74) *Attorney, Agent, or Firm* — Merchant & Gould P.C.

(57) ABSTRACT

A thin film display element (100) has at least one emissive area (103) in the display region (101) and a layer structure (104) comprising: a first patterned conductor layer (110) comprising a first display electrode (111) in the display region; a second patterned conductor layer (120) comprising a second display electrode (121) in the display region; and an emissive layer (130) between the first and the second conductor layers configured to emit light in the at least one emissive area. The patterned conductor layers further comprise a first touch electrode (141) and a second touch electrode (142) in the display region, the first and the second touch electrodes forming a touch sensor (140) for capacitive touch or proximity sensing.

11 Claims, 3 Drawing Sheets

(58) Field of Classification Search
USPC .......................................................... 345/173
See application file for complete search history.

(56) References Cited

U.S. PATENT DOCUMENTS

| | | |
|---|---|---|
| 2014/0333570 A1 | 11/2014 | Lesonen |
| 2015/0042600 A1 | 2/2015 | Lukanc et al. |
| 2015/0060817 A1 | 3/2015 | Sato et al. |
| 2016/0034072 A1 | 2/2016 | Yang et al. |
| 2017/0031480 A1 | 2/2017 | Gabriel et al. |
| 2017/0083163 A1 | 3/2017 | Liu et al. |
| 2017/0108979 A1 | 4/2017 | Lu et al. |
| 2018/0039360 A1 | 2/2018 | Akimoto et al. |

OTHER PUBLICATIONS

Written Opinion of the International Searching Authority for corresponding International Patent Application No. PCT/FI2019/050142 dated May 23, 2019, 9 pages.
Finnish Search Report for corresponding Finnish Patent Application No. 20185173 dated Sep. 13, 2018, 2 pages.

\* cited by examiner

THIN FILM DISPLAY ELEMENT

This application is a National Stage Application of PCT/FI2019/050142, filed 21 Feb. 2019, which claims benefit of Patent Application Serial No. 20185173, filed 23 Feb. 2018 in Finland and which applications are incorporated herein by reference. To the extent appropriate, a claim of priority is made to each of the above disclosed applications.

BACKGROUND

Thin film displays, such as inorganic thin film electroluminescent TFEL displays and thin film organic light emitting diode OLED displays may be used in various applications.

Examples of applications where such displays, especially transparent displays, may be used include Head-Up Displays HUDs integrated into the windshields or windscreens of aircrafts, vehicles, or heavy machines; displays integrated into display windows or display cases; as well as different medical and other types of devices that encompass a transparent casing. Other applications exist where the display may be opaque.

In many of these applications, touch-based interactivity with a display may be a desired feature. Feasibility of such touch-based interactivity may strongly depend on the complexity of the technical arrangement required.

SUMMARY OF THE INVENTION

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A thin film display element with a display region may be implemented, which display element extends substantially along a base plane defining a lateral extension of the display element. The display element has at least one emissive area in the display region and a layer structure comprising: a first patterned conductor layer comprising a first display electrode in the display region, connected to the outside of the display region via a first display conductor trace; a second patterned conductor layer comprising a second display electrode in the display region, connected to the outside of the display region via a second display conductor trace; and an emissive layer between the first and the second conductor layers configured to emit light in the at least one emissive area upon electrical voltage coupled over the emissive layer in the at least one emissive area between the first and the second conductor layers.

The first and the second display electrodes may overlap at least partially each other in an overlapping area, whereby the at least one emissive area may be defined by the overlapping area.

Advantageously, the first or the second patterned conductor layer further comprises a first touch electrode in the display region; and the first or the second patterned conductor layer further comprises a second touch electrode in the display region, laterally separated from the first touch electrode.

The first and the second touch electrodes are connected to the outside of the display region via a first and a second touch conductor trace, respectively.

The first and the second touch electrodes form a touch sensor for capacitive touch or proximity sensing.

For each of the first and the second touch electrodes formed in one of the patterned conductive layers, the other patterned conductive layer comprises, at the location of the touch electrode, a passive touch region galvanically isolated from the outside of the display region.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

The drawings of FIGS. 1 to 4 are schematic and not to scale.

DETAILED DESCRIPTION

The detailed description provided below in connection with the appended drawings is intended as a description of a number of embodiments and is not intended to represent the only forms in which the embodiments may be constructed, implemented, or utilized.

A "display element" refers to an element which may form, as such, a complete, operable display. Alternatively, a display element may be used as one element of a complete display assembly comprising also other elements, units, and/or structures.

A "display" is to be understood broadly here, covering naturally "normal", actual displays capable of displaying various patterns, images, or text, but also, for example, various control panels and user interface elements with at least one emissive area for emitting light therefrom.

Figure 1:
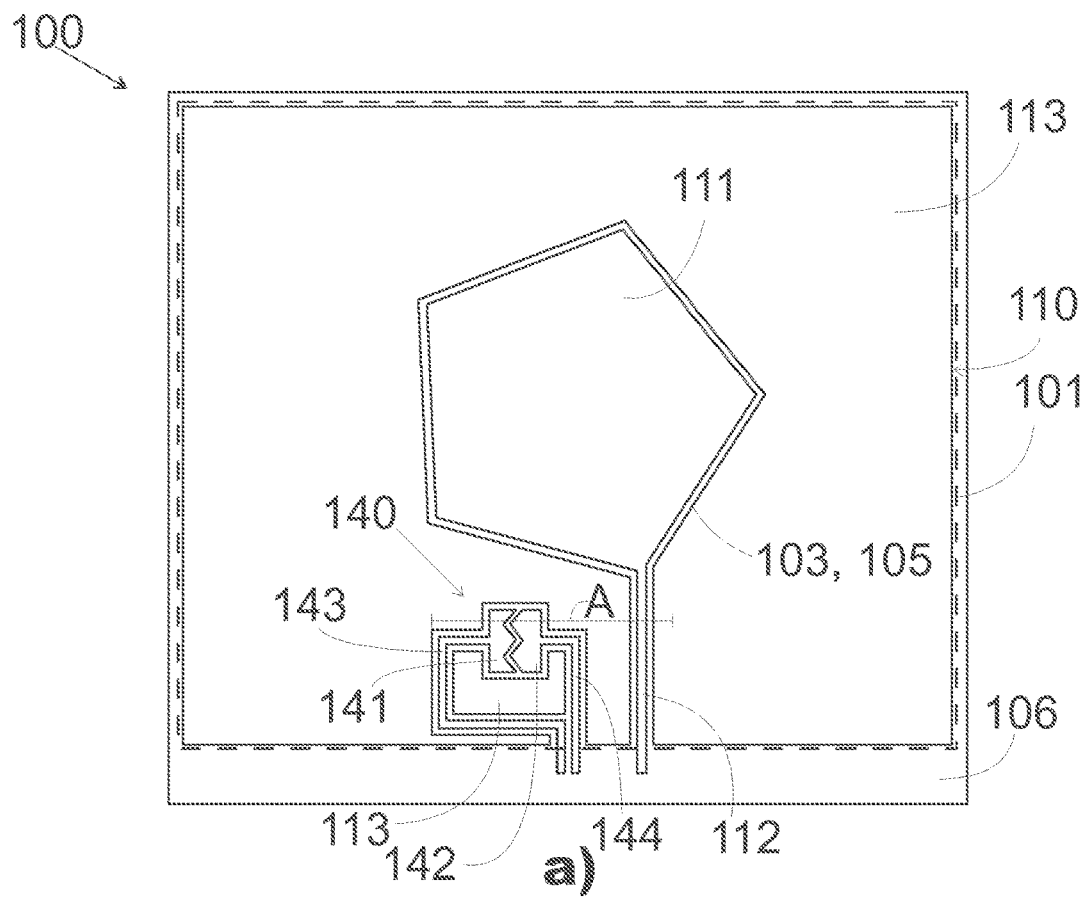
FIG. 1 illustrates top views of a thin film EL display element and layers thereof.
Figure 1:
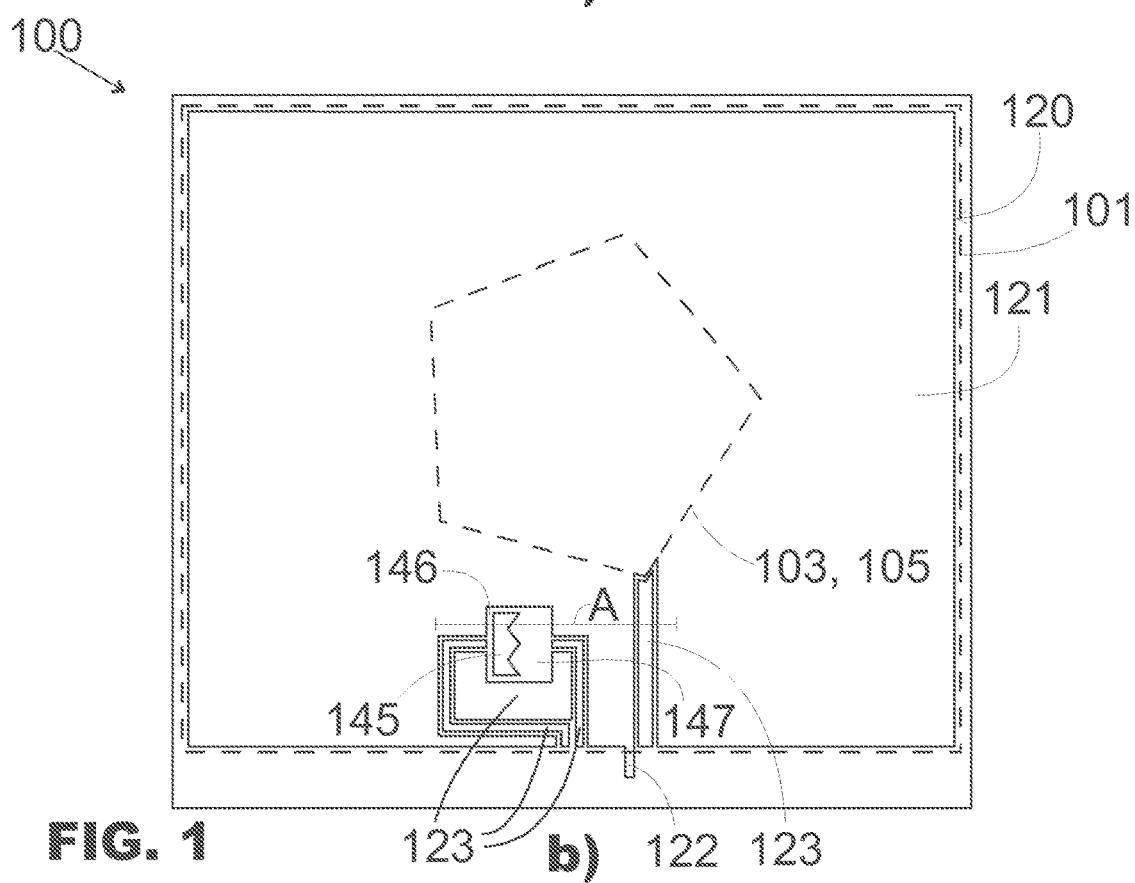

The thin film display element 100 of FIG. 1 has a display region 101.

A "display region" refers to a predetermined area or region, observed or defined in the lateral direction of the display element 100, in which display region one or more emissive areas are capable of emitting light to form the actual visual information to be displayed by the display element.

Outside the display region, there is a connecting region 106. In the example of FIG. 1, the connecting region lies at an edge of the display element. In other embodiments, differently located connecting regions may be implemented. Some embodiments may be possible without any specific connecting region.

Figure 2:
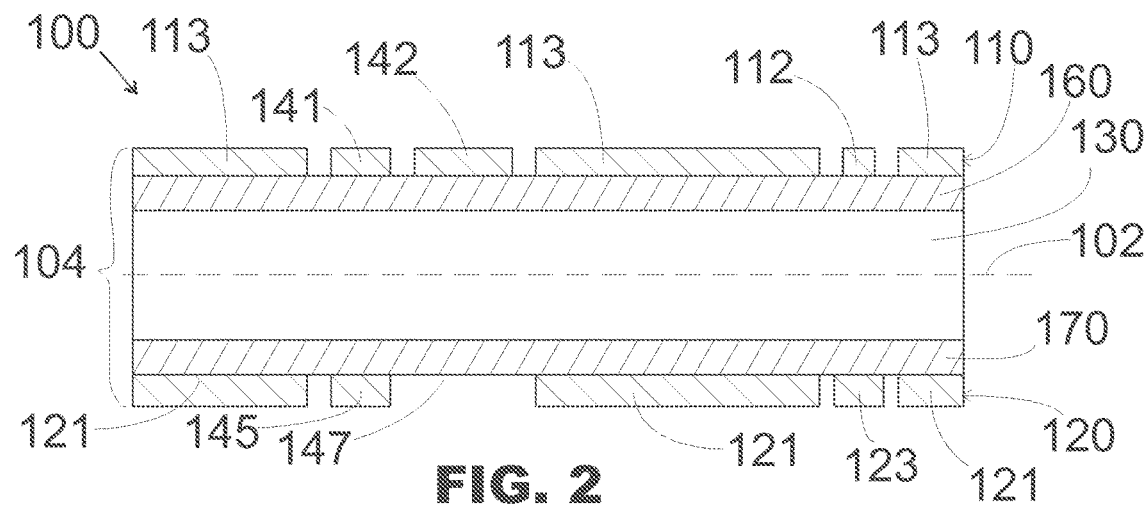
FIG. 2 illustrates a sectional view of the thin film EL display element of FIG. 1.

The display element 100 extends substantially along a base plane 102 as illustrated in FIG. 2 showing the cross section of the display element of FIG. 1 along line A. In the example of FIGS. 1 and 2, the base plate is planar. In other embodiments, display elements may be curved, thus extending substantially along curved base planes.

Further, although illustrated as a planar structure in FIG. 2, the display element 100 may be formed as a flexible or bendable structure. Therefore, the base plane may also be variable. Thus, the lateral extension basically refers to the width directions of the display element, in which width directions the display element may have dimensions substantially larger than in the perpendicular direction, i.e. the thickness direction.

The display element 100 has a layer structure 104 comprising, superposed in the thickness direction of the display element, the actual operational layers of the display element: a first patterned conductor layer 110; a second patterned conductor layer 120; and an emissive layer 130 between the first and the second patterned conductor layers.

In FIG. 1, the layout of the first patterned conductor layer is illustrated in drawing a), and the layout of the second patterned conductor layer is illustrated in drawing b).

In the example of FIGS. 1 and 2, the emissive layer 130 is separated from the first and the second patterned conductor layers 110, 120 by a first and a second dielectric layers 160, 170, respectively. In addition, although not illustrated in FIG. 1, there may be, at least in some embodiments, some additional layers between or on those five layers.

Figure 3:
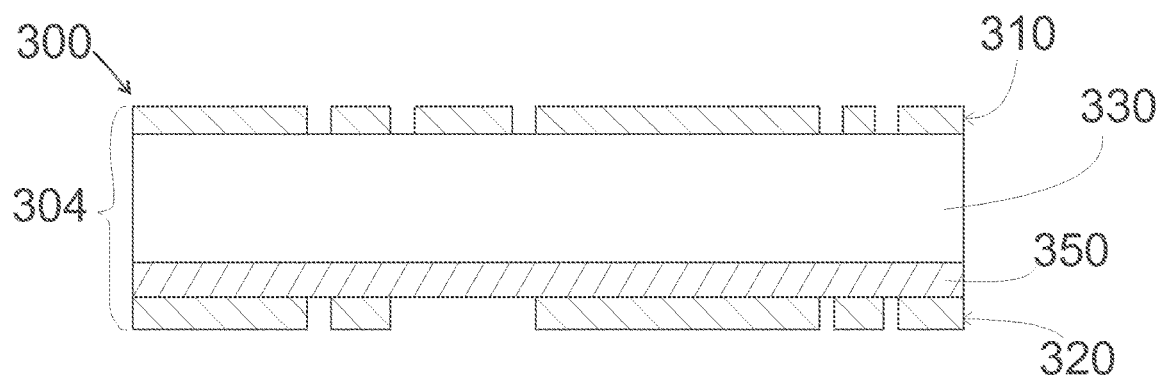
FIG. 3 illustrates a sectional view of an OLED display element.

The display element 100 of FIGS. 1 and 2 is an inorganic thin film electroluminescent EL display element. In other embodiments, it is possible to implement display elements of any other appropriate types having a first conductor layer, a second conductor layer, and an emissive layer between the first and the second conductor layers, the emissive layer being configured to emit light in an emissive area with a suitable voltage coupled over the emissive layer in the emissive area between the first and the second conductor layers. An example of such other display type is illustrated in FIG. 3.

The "thin film" nature of the display element refers to the total thickness of the layer structure 104 of the five operational layers, said total thickness being less than or equal to 10 μm. Individual layers may have thicknesses, for example, in the range of a few nanometers to some hundreds of nanometers or some micrometers.

Although not illustrated in FIG. 2, the layer structure 104 may be formed on any appropriate substrate or carrier. For example, in the case of a transparent display element, a transparent substrate may be formed of glass, such as sodalime or aluminosilicate glass, or some other suitable material such as any other appropriate transparent glass or plastic. Possible plastic materials include, for example, polyethylene PE, and polycarbonate PC, without being limited to these examples. Such substrate or carrier may protect the layer structure, and also serve as an electrically insulating layer between the layer structure and the ambient. Further, there may also be another protective and insulating layer on the opposite side of the layer structure. Such another layer may be formed by an external layer or element to which a display element is attached.

"Conductor" refers to an electrical conductor material of a conductor layer, and the electrical conductivity thereof.

"Emissive" refers to the material of the emissive layer being capable of emit light when electrical voltage is coupled over the emissive layer between the first and the second conductor layers.

The emissive layer 130 as the luminescent layer of the EL display element of FIG. 1 may comprise, for example, manganese-doped zinc sulfide ZnS:Mn as the luminescent material. Naturally, also other luminescent materials are possible.

The display element 100 of FIG. 1 may be implemented as a transparent display element. Embodiments are also possible where the display element is opaque.

"Transparent" refers to optical transparency of the display element and the layers, parts, and materials thereof in the relevant wavelength range at issue. In other words, "transparent" material or structure refers to a material or structure allowing light, or generally electromagnetic radiation, at such relevant wavelength range to propagate through such material or structure. The relevant wavelength range may depend on the application where the transparent display element is to be used. In some embodiments, the relevant wavelength range may be the visible wavelength range, i.e. from about 390 nm to about 700 nm.

Further, the transparency of a transparent display element and the parts thereof primarily refers to the transparency in the thickness direction of the transparent display element. Thus, in order to be "transparent", sufficient portion of light energy incident on the transparent display element or a part thereof shall propagate through it in the thickness direction and exit it substantially in the initial direction thereof. Such sufficient portion may depend on the application in which the transparent display element is to be used. For some applications, such portion may be, for example, at least 70 or 90% of the energy of light incident perpendicularly on the transparent display element, at a location where the entire layer structure of the operational layers is present.

Said maintaining of the initial direction of propagation also after having propagated through the display element, without being significantly diffused or scattered, refers to optical clarity of the transparent display element.

The first and the second dielectric layers 160, 170 may comprise, for example, aluminum oxide or any other appropriate dielectric material.

The first and the second conductor layers 110, 120 may comprise, for example, indium tin oxide ITO, aluminum-doped zinc oxide AZO (ZnO:Al), or any other appropriate transparent conductive oxide TCO or other transparent conductor material. The conductor layer may additionally or alternatively comprise, for example, thin metal mesh. Also such layers, with sufficiently low thicknesses, may be substantially transparent.

In other embodiments, any of the emissive layer, the first and the second dielectric layers, and the first and the second conductor layers may comprise a plurality of sublayers of different materials or compositions.

Being "patterned" refers to the first and the second patterned conductor layers extending non-uniformly over the display element, i.e. as a structure comprising one or more discontinuities within the area of it. Such patterned nature may be implemented by several patterns where the conductor material is present, the patterns being separated from each other. In some embodiments, a patterned conductor layer may be implemented with just one conductor material pattern. Then, the "patterned" nature of that layer may be implemented with the pattern not covering the entire area of the display element, so that there is at least one opening or region in the area of the display element free of the conductor material of that patterned conductor layer.

The first patterned conductor layer 110 comprises a first display electrode 111 having a shape of a pentagon. The first display electrode is located in the display region 101, and it is connected to the outside thereof via a first display conductor trace 112.

Being connected to the outside of the display region refers to the extension of the first conductor trace 112 outside the display region 101 so that the first conductor trace and thus the first display electrode may be electrically connected to appropriate external electrical circuitry via a connection made outside the display region. In the example, such connection(s) may be formed in the connecting region 106.

The second patterned conductor layer 120 comprises a second display electrode 121 covering a major part of the display region. The second display electrode is connected to the outside of the display region, to the connecting region 106, via a second display electrode conductor trace 122.

The first and the second display electrodes overlap in an overlapping area 105. In the example of FIG. 1, because the second display electrode covers a major part of the display region and extends beyond the area of the first display electrode, the overlapping area is actually defined by the shape and location of the first display electrode. In other embodiments, there may be, for example, overlapping first and second display electrodes with substantially the same shape and size.

The overlapping area 105 of the first and the second display electrodes 111, 121 define an emissive area 103.

"Emissive" area refers to an area in which an emissive layer is configured to emit light upon suitable electrical voltage coupled over the emissive layer in the emissive area between the first and the second conductor layers. Thus, with appropriate voltage applied over the emissive layer between the first and the second display electrodes 111, 121, light may be emitted from the emissive layer in the emissive area 103.

Figure 5:
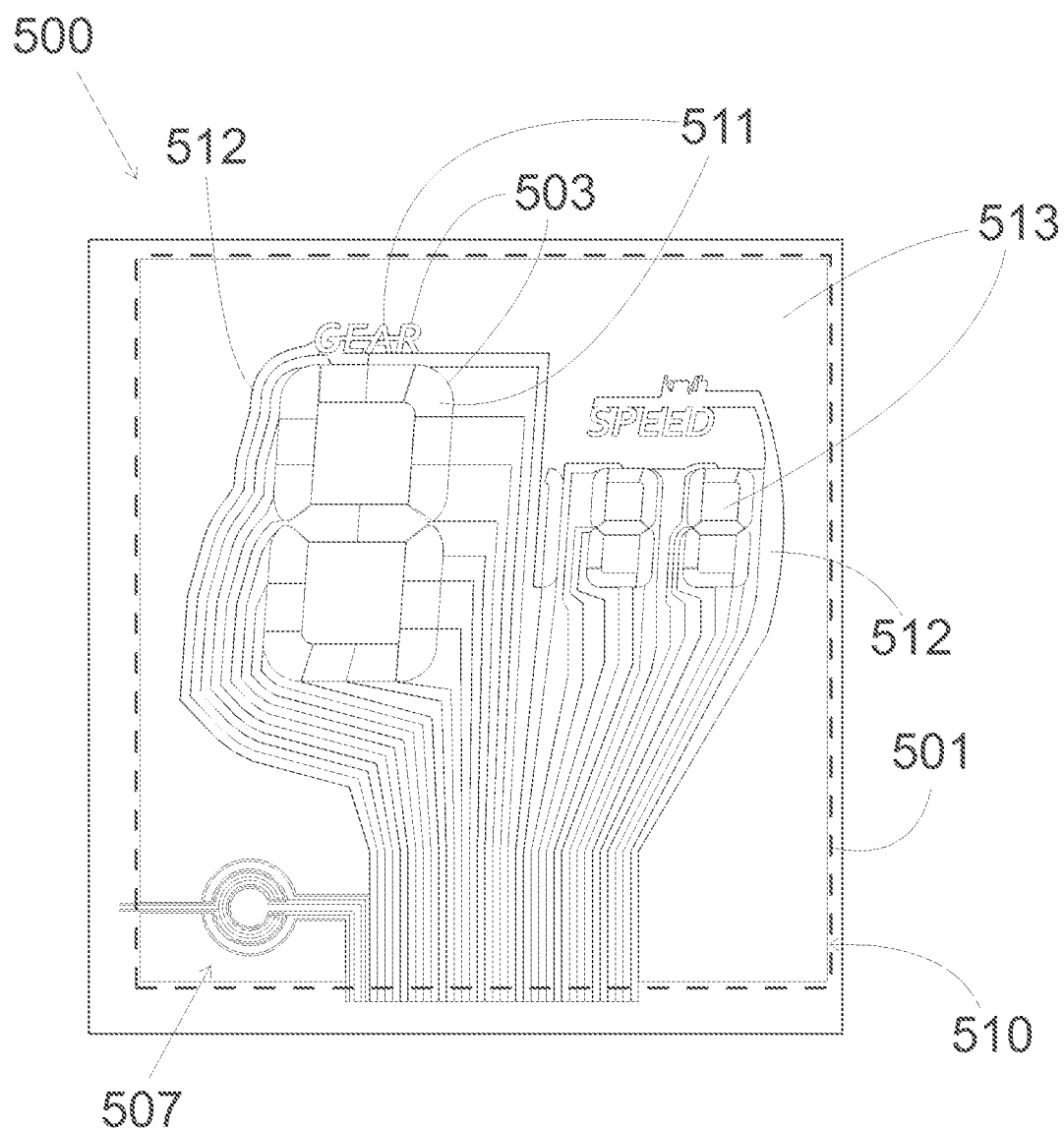
FIG. 5 illustrates a top view of a segment type display element.

In the illustrative example of FIG. 1, there is the single pentagon-shaped emissive area 103 in the display region 101. In other embodiments, however, a display region may comprise a plurality of emissive areas each defined by an overlapping area of opposing display electrodes in the first and the second patterned conductor layers. Such display element may be, for example, a segment-type display where the emissive areas form individually or group-by-group controllable segments of letters, numbers, or other symbols to be displayed in the display region. An example of such display element is illustrated in FIG. 5. Basically, irrespective of the number of the emissive areas present in the display region, one emissive area may have any appropriate shape and size, which may be unique or the same as the shape and size of one or more other emissive areas.

A "segment type" display element refers basically to a display element with display electrodes specifically shaped and located in accordance with the desired arrangement of the emissive areas. Typically, there is one display conductor trace for each display electrode.

In yet other examples, instead of a segment type display configuration, matrix type display elements may be implemented with conductor patterns of the two patterned conductor layers defining the emissive areas at locations where the conductor patterns overlap. Then, the overlapping parts of the conductor patterns may thus serve as the display electrodes.

In addition to the first display electrode 111, the first patterned conductor layer 110 comprises also a first and a second touch electrode 141, 142 in the display region. The first and the second touch electrodes are connected to the outside of the display region 101, to the connecting region 106 of the display element, via a first and a second touch conductor trace 143, 144, respectively.

The first and the second touch electrodes 141, 142 form a capacitive touch sensor 140. The touch sensor may be used for capacitive detection of a touch of an external object, such as a finger or a stylus, on the display element. Depending on the detection sensitivity, the capacitive touch sensor may also be used for detecting the presence of an external object in sufficiently close proximity to the display electrode, thus pointing the display element.

The touch sensor may be operated in accordance with any appropriate principles and by means of any appropriate circuitry and signals known in the art for capacitive touch and/or proximity sensing. For example, the touch sensor may be configured to be operated in accordance with principles of projected capacitive PCAP technology. In PCAP touch technology, touch is detected in result of a change of a coupling capacitance between the two touch electrodes, caused by the introduction and removal of dielectric and possibly lossy media of a touching member, e.g. human finger, sufficiently close to the touch electrodes.

As mentioned above with reference to FIG. 2, the touch electrodes may be electrically insulated from the ambient, for example, by a plate or layer (not illustrated in the drawings of the FIGs.) formed of glass or some other appropriate, preferably transparent material. Then, a touching member, even in contact with the display element does not significantly affect the resistance between the two touch electrodes.

In the example of FIG. 1, the touch electrodes of the capacitive sensor have their opposite edges formed with complementary zig-zag shapes. In this way, the length of the opposing edges and thus the capacitance of the capacitive sensor may be increased. The distance between the opposing edges may be in the range of 0.1 mm to 5 mm, preferably in the range of 0.5 mm to 3 mm, for example about 2 mm. This is an illustrative example; in other embodiments, any other appropriate shapes of touch electrodes may be used.

The touch sensor may advantageously enable implementation of a user interface of the display element which is operable by touching or pointing the display element or the touch sensor thereof. That way, interactive display elements and displays may be implemented without any additional layers present in the display element. The touch sensor may be manufactured in the same process as the display electrodes, with no additional process steps.

The display element layer structure has, for each of the first and the second touch electrodes 141, 142, at the location of the electrode, a passive touch region in the second patterned conductor layer 120, which passive touch region is galvanically isolated from the outside of the display region.

Being galvanically isolated from the outside of the display region refers to the passive touch region not being connected via any conductor trace or pattern to the outside of the display region. Such an isolated region is thus not to be electrically connected to the outside of the display region.

For the first touch electrode 141, the passive touch region comprises a passive touch conductor pattern 145, which is separated from the surrounding second display electrode 121 by an isolation gap 146, which is free of the conductor material. In the example of FIG. 1, the passive touch conductor pattern has substantially the same shape and size as the first touch electrode of the first patterned conductor layer 110, and lies at the same location with that.

In the example of FIG. 1, for the second touch electrode 142, the passive touch region comprises an opening 147 in the second patterned conductor layer 120 at the location of the second touch electrode. In other embodiments, there may be similar passive touch regions for the first and the second touch electrodes.

In other embodiments, first and second touch electrodes may be formed in the second patterned conductor layer of a display element. In yet other embodiments, first and second touch electrodes may be formed in different patterned conductor layers of a display element, in which case a projection of the first touch electrode on the base plate is laterally separated from a projection of the second touch electrode on the base plate by a distance, which may be in the range of 0.1 mm to 5 mm, preferably in the range of 0.5 mm to 3 mm, for example about 2 mm. In the case of the first and the second electrodes lying in different layers, said lateral separation concerns the projections of the first and the second electrodes on a common plane parallel to the base plane, or the base plane itself. Thus, the lateral separation refers to the positioning of the first and the second electrodes in the lateral directions. In each case, for a touch electrode formed in one of the patterned conductor layer, the other patterned conductive layer may comprise, at the location of the touch electrode at issue, a passive touch region galvanically isolated from the outside of the display region.

The first and the second patterned conductor layers comprise also other passive conductor patterns in the display region. In the example of FIG. 1, those other passive conductor patterns are not electrically or galvanically connected to the outside of the display region.

In the first patterned conductor layer 110, there is a passive conductor pattern 113 surrounding and being separated from the first display electrode and the first display conductor trace 112. Another passive conductor pattern 113 is formed in the space between the first and the second touch conductor traces 143, 144.

In the second patterned conductor layer 120, there is a passive conductor pattern 123 located opposite to the first display conductor trace 112. Further, passive conductor patterns 123 lie opposite to the first and the second touch conductor traces 143, 144 of the first patterned conductor layer. Yet another passive conductor pattern 123 is formed between those two conductor patterns, substantially opposite to the passive conductor pattern 113 of the first patterned conductor layer lying in the space between the first and the second touch conductor traces 143, 144.

Passive conductor patterns are "passive" in the sense that they are not to be used for activating any emissive area. In this sense, passive conductor patterns do not necessarily need to be, although in some embodiments they may be, electrically connected to the outside of the display region. However, they may advantageously enable the first and the second patterned conductor layers 110, 120 to cover a major part of the display region 101. There may be just small gaps having a width, for example, of some tens of micrometers present between the passive conductor patterns and the other conductor patterns of the patterned conductor layers. Thereby, the conductor material may cover, for example, about 80% or more of the area of the display region.

With such major part of the display region being covered by the first and the second patterned conductor layers, the optical structure and thus the visual appearance of the display region may be very uniform.

The display element 300 of FIG. 3 differs from that of FIGS. 1 and 2 in that it is a thin film organic light emitting diode OLED display element, a particular type of thin film electroluminescent TFEL display element.

The layer structure 304 of the display element 300 comprises an emissive layer 330 and a current transport layer 350 between the first and second patterned conductor layers 310, 320 forming the electrodes of the matrix type display element. The current transport layer of an OLED may also be called a "conductive/conducting layer". In other embodiments, OLED display elements with different layer configurations are possible. For example, there may be a hole transport layer and an electron transport layer on the opposite sides of an emissive layer.

The first and second patterned conductor layers 310, 320 have layouts in accordance with the layouts of the first and the second patterned conductor layers, respectively, of the display element of FIGS. 1 and 2. Thus, there are first and second display electrodes, first and second touch electrodes, as well as various passive conductor patterns in the OLED display element 300, similarly to display element of FIGS. 1 and 2. In other embodiments, different layouts, i.e. different patterning, of the patterned conductor layers are possible.

Figure 4:
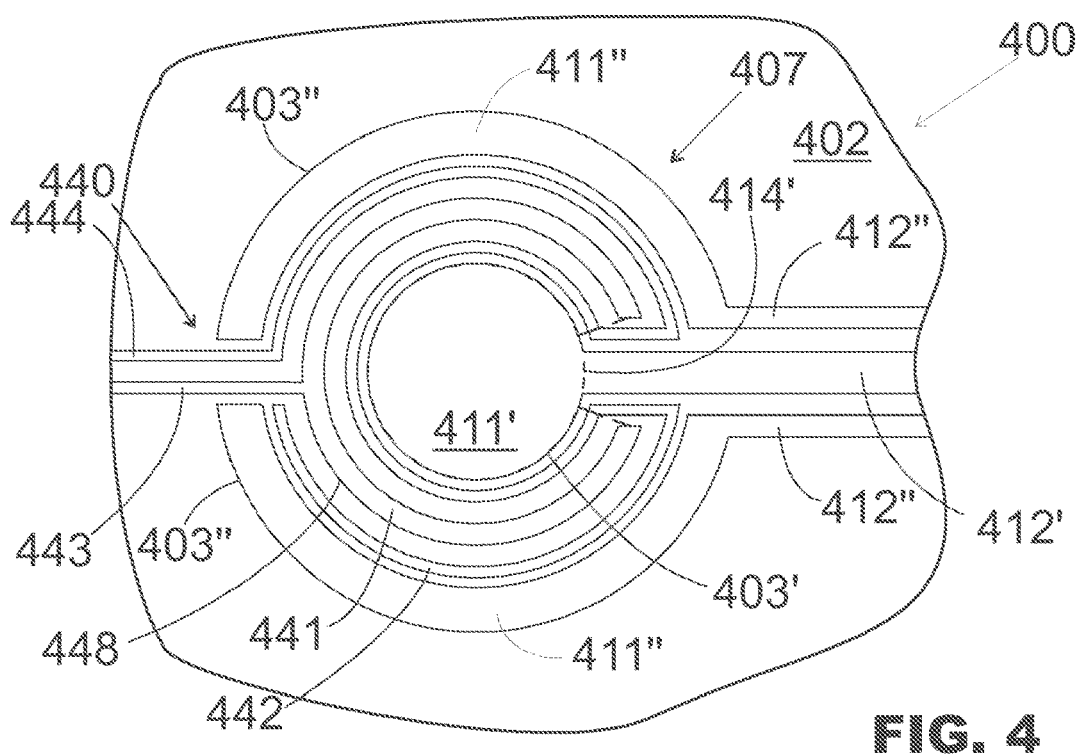
FIG. 4 illustrates a top view of part of a display element.

The display element 400 partially shown in FIG. 4 comprises an electrode configuration 407 in the display region 402 thereof. The display element may be of any appropriate display element type with a layer structure and an overall configuration in accordance with any of those discussed above with reference to FIGS. 1 to 3. The electrode configuration enables implementing a display element comprising, in addition to emissive areas, also a touch sensor for capacitive touch or proximity sensing.

In the example of FIG. 4, all the patterns of the electrode configuration lie in a first patterned conductor layer. In other embodiments, all the patterns of an electrode configuration may lie in a second patterned conductor layer. In yet other embodiments, the electrodes of an electrode configuration may be distributed with one or more of them formed in one of the patterned conductor layers, and the rest in the other patterned conductor layer.

The electrode configuration 407 comprises an inner first display electrode 411' having a circular shape. The inner first display electrode is connected to an inner first display conductor trace 412' via which it can be electrically connected to the outside of the display region.

The inner first display electrode 411' is surrounded by a curved first touch electrode 441. The first touch electrode encircles substantially the entire perimeter 414' of the circular inner first display electrode 411' so that there is an opening in the curved first touch electrode for the inner first display conductor trace 412' only. In the example of FIG. 4, the first touch electrode encircles about 90% of the perimeter 414' of the circular inner first display electrode. In other embodiments, the portion of the perimeter of an inner first display electrode encircled by a first touch electrode may be, for example, 80% or more of the length of the perimeter.

A portion of the perimeter of a first pattern being encircled by a second pattern refers to that at each point of that portion of the perimeter, the second pattern is present outside the first pattern in a direction perpendicular to that point. Such perpendicular directions are marked in the drawing of FIG. 4 by dashed lines at the ends of the perimeter portion of the inner first display electrode encircled by the first touch electrode. In the case of the first and the second patterns lying in different layers, said encircling concerns the projections of the first and the second patterns on a common plane parallel to the base plane, or the base plane itself. Thus, the encircling refers to the positioning of the first and the second patterns in the lateral directions.

A second touch electrode 442 is formed as a curved conductor pattern surrounding the first touch electrode from both sides of it, thus encircling more than half of the perimeter 448 of the first touch electrode. In the example of FIG. 4, the second touch electrode actually encircles more than 90% of the overall perimeter of the first touch electrode.

The second touch electrode encircling more than half of the perimeter of the first touch electrode may advantageously increase the capacitance between the first and the second touch electrodes, and thereby improve the sensitivity of the touch sensor 440 formed by the first and the second touch electrodes.

In other embodiments, said principle of two touch electrodes with one of them encircling the major part of the perimeter of the other may be utilized for other touch electrode geometries.

The first and the second touch electrodes are connected to first and second touch conductor traces 443, 444, respectively, via which they can be electrically connected to the outside of the display region.

There are two additional display electrodes, namely, a pair of outer first display electrodes 411" located at the opposite sides of and surrounding, as curved patterns, the inner first display electrode 411' and the touch sensor 440. The outer first display electrodes are connected to outer first touch conductor traces 412" via which they can be electrically connected to the outside of the display region.

For each of the outer and inner first display electrodes, there may be corresponding outer and inner second display electrodes in the second patterned conductor layer (not illustrated). Thereby, inner and outer emissive areas 403', 403" may be defined in accordance with the shapes of the outer and inner first display electrodes.

The electrode configuration 407 of FIG. 4 may advantageously enable having a touch sensor and one or more emissive areas of a display element close to each other. Such arrangement may be utilized, for example, in implementing an interactive user interface where light is emitted, with the display element in use, from the inner emissive area to indicate the intended location for touch or pointing input. Then, when touch or pointing of the display element is detected by the touch sensor surrounding the inner emissive area, also the outer emissive areas may be activated to emit light to indicate that the user input was received.

The circular inner emissive area 411' may have a width, thus a diameter, in the range of 2 to 7 mm, preferably in the range of 3 to 6 mm, for example, about 4 or 5 mm. With such width, which corresponds to the typical size of the contact area of a touch of a human finger, advantages may be achieved in that the touch sensor may closely surround or fit within such typical contact area. That may result in reliable touch or proximity detection. Further, with a finger or other touching or pointing object covering the inner emissive area, the outer emissive areas provide visible means to indicate the detected touch on, or pointing of, the display element. The outer emissive areas may also be activable separately, i.e. independently from each other.

In other embodiments, the principle of touch and display electrodes lying inside each other may be implemented in electrode configurations with any other appropriate overall geometries, such as oval, rectangular, or square ones. Then, the above ranges for the width of the inner emissive area may apply to the maximum width of the inner emissive area, i.e. the maximum distance along a straight line crossing the inner emissive area.

The segment type display element 500 of FIG. 5 may have a layer structure in accordance with any of those discussed above with reference to FIGS. 1 to 3. In the display element, a plurality of first display electrodes 511 are formed as conductor segments in the first conductor layer 510. Complementary conductor segments are formed of the second conductor layer which is not visible in the drawing of FIG. 5. Those conductor segments define the segment-type emissive areas 503 of the display element in the form of letters, numbers, and parts thereof. The first display electrodes are connected via a plurality of first display conductor traces 512 to the outside of the display region 501.

The first patterned conductor layer 510 further comprises an electrode configuration 507 in accordance with that of FIG. 4. In other embodiments, the display and touch electrodes of the electrode configuration may lie in the second patterned conductor layer, or they may be distributed in both of the first and the second patterned conductor layers.

The electrode configuration 507 may serve for providing a touch-based user interface of the display element 500. For example, it may enable activation, i.e. switching on, of the display element by touching or pointing the inner emissive area of the electrode configuration.

A display element in accordance with that of FIG. 5 may be used to implement, for example, a Head-Up Display HUD integrated into the windshield or windscreen of a vehicle or a heavy machine, such as a tractor.

In the above, display elements are discussed with a focus on the actual operational layers thereof. Display elements may be implemented in accordance with any of those discussed above, further comprising control or operating electronics or circuitry connected to the display electrodes and the touch electrodes for carrying out the actual display and touch detection functions.

Change in coupling capacitance of the touch sensor can be detected, for example, using any appropriate type of touch controller circuit, possibly realized as a small integrated circuit, connected to the first and second touch electrodes via the first and the second touch conductor traces, respectively. Such touch controller circuits are commercially available. The first touch electrode may operate as a transmitter (TX) of a voltage signal, and the change of the coupling of the voltage signal to the second touch electrode serving as a receiver electrode (RX) can be detected. This change of coupling of the voltage signal (either in magnitude or phase of the voltage, or both) is caused by the change of the coupling capacitance between the electrodes, and the change in the coupling capacitance, in turn, being caused by the touch or sufficiently close pointing by an external object capable of sufficiently altering the coupling capacitance.

A driving voltage of the display electrodes may be generated and supplied by a display driver circuit (also not shown in the FIGs.) of any appropriate type, realized as dedicated integrated circuit. Also such display driver circuits are commercially available. The first and the second display electrodes may be connected to the outputs of the driver circuit via the first and the second display conductor traces, respectively.

An inorganic thin film electroluminescent (inorganic TFEL) type of display has usually an alternating or pulsed driving voltage applied over the first and second display electrodes. Amplitudes of the pulses can be e.g. +195V and −195V, generated by an inorganic TFEL specific driver circuit and fed to the first and second display electrodes through conductors from the outputs of the driver circuit.

An organic light-emitting diode (OLED) type of display is a display in which the emissive layer is a film of organic compound that emits light in response to an electric current flowing between the first and second display electrodes. This current is created by a voltage applied over the first and second display electrodes through conductors connected to the outputs of an OLED specific driver circuit, typically operating with a lower voltage than an inorganic TFEL specific driver circuit.

Both OLED and inorganic TFELs are electroluminescent displays as they comprise material that emits light when suitably electrically excited.

A touch controller circuit and a display driver circuit may form sub-circuits or parts of one single control circuit.

Any of the display elements discussed above may be manufactured by any appropriate method. The layer structure may be formed on any appropriate, possibly transparent substrate which may serve, in the completed structure, a protective and insulating surface layer of the display element. One or more of the layers may be grown or deposited, for example, by atomic layer deposition ALD or sputtering.

Any appropriate patterning processes may be used to pattern the patterned conductor layers. A conductor layer may be patterned, for example, using the same lithographic process(es) by which the patterned electrodes of electroluminescent display elements, e.g. OLED display elements, are typically patterned. Such patterning process may comprise several stages, such as cleaning, drying, photoresist coating, pre-baking, exposure, developing, etching and stripping with cleaning/drying steps. For example, lithographic patterning for ITO as the material of a conductor layer may be carried out with an automated photolithography in-line tool utilizing wet-chemical processes. The selected etchant, which may be, for example, a mixture of $HCl$ and $HNO_3$ acids, removes the desired areas of the conductor layer.

It is to be noted that the present invention is not limited to the embodiments and examples above. Instead, the embodiments of the present invention can freely vary within the scope of the claims.

It will be understood that the benefits and advantages described above may relate to one embodiment or example or may relate to several embodiments or examples. The embodiments and examples are not limited to those that solve any or all of the stated problems or those that have any or all of the stated benefits and advantages. It will further be understood that reference to 'an' item refers to one or more of those items.

The term "comprising" is used in this specification to mean including the feature(s) followed thereafter, without excluding the presence of one or more additional features.

The invention claimed is:

1. A thin film display element with a display region, extending substantially along a base plane defining a lateral extension of the display element, and having at least one emissive area in the display region, the display element having a layer structure comprising:
   a first patterned conductor layer comprising a first display electrode in the display region, connected to the outside of the display region via a first display conductor trace;
   a second patterned conductor layer comprising a second display electrode in the display region, connected to the outside of the display region via a second display conductor trace; and
   an emissive layer between the first and the second conductor layers configured to emit light in the at least one emissive area upon electrical voltage coupled over the emissive layer in the at least one emissive area between the first and the second conductor layers;
   the first and the second display electrodes at least partly laterally overlapping each other in an overlapping area, the at least one emissive area being defined by the overlapping area;
   the first or the second patterned conductor layer further comprising a first touch electrode in the display region, and the first or the second patterned conductor layer further comprising a second touch electrode in the display region, laterally separated from the first touch electrode, the first and the second touch electrodes being connected to the outside of the display region via a first and a second touch conductor trace, respectively, the first and the second touch electrodes forming a touch sensor for capacitive touch or proximity sensing; and for each of the first and the second touch electrodes formed in one of the patterned conductive layers, the other patterned conductive layer comprising, at the location of the touch electrode, a passive touch region galvanically isolated from the outside of the display region.

2. A thin film display element as defined in claim 1, wherein the passive touch region comprises a passive touch conductor pattern separated from the other conductor pattern(s) of said other patterned conductor layer by an isolation gap.

3. A thin film display element as defined in claim 1, wherein the passive touch region comprises an opening in said other patterned conductor layer.

4. A thin film display element as defined in claim 1, wherein at least one of the electrodes of the touch sensor encircles more than half, preferably at least 80% of the perimeter of the at least one emissive area.

5. A thin film display element as defined in claim 4, wherein the at least one emissive area has a maximum width in the range of 2 to 7 mm, preferably in the range of 3 to 6 mm, for example, about 4 or 5 mm.

6. A thin film display element as defined in claim 1, comprising a plurality of emissive areas.

7. A thin film display element as defined in claim 1, wherein a projection of the second touch electrode on the base plate encircles more than half of a projection of the perimeter of the first touch electrode on the base plate.

8. A thin film display element as defined in claim 1, implemented as a segment type display element.

9. A thin film display element as defined in claim 1, implemented as a thin film electroluminescent TFEL display element.

10. A thin film display element as defined in claim 9, implemented as an inorganic thin film electroluminescent TFEL display element.

11. A thin film display element as defined in claim 9, implemented as a thin film organic light emitting diode OLED display element.

* * * * *